United States Patent
Dunsmore et al.

(10) Patent No.: US 10,042,029 B2
(45) Date of Patent: Aug. 7, 2018

(54) CALIBRATION OF TEST INSTRUMENT OVER EXTENDED OPERATING RANGE

(71) Applicant: Keysight Technologies, Inc., Minneapolis, MN (US)

(72) Inventors: Joel P. Dunsmore, Sebastopol, CA (US); Johan Ericsson, Windsor, CA (US)

(73) Assignee: Keysight Technologies, Inc., Santa Rosa, CA (US)

(*) Notice: Subject to any disclaimer, the term of this patent is extended or adjusted under 35 U.S.C. 154(b) by 747 days.

(21) Appl. No.: 13/863,721

(22) Filed: Apr. 16, 2013

(65) Prior Publication Data

US 2014/0306719 A1   Oct. 16, 2014

(51) Int. Cl.
  *G01S 7/40* (2006.01)
  *G01R 35/00* (2006.01)
  *G01R 27/28* (2006.01)

(52) U.S. Cl.
  CPC ............ *G01R 35/005* (2013.01); *G01R 27/28* (2013.01)

(58) Field of Classification Search
  USPC ............... 364/578; 324/601; 333/103; 702/2
  See application file for complete search history.

(56) References Cited

U.S. PATENT DOCUMENTS

| 4,644,486 A | 2/1987 | Cannon et al. |
| 5,117,377 A * | 5/1992 | Finman ............ G01S 7/4004 333/103 |
| 8,022,687 B2 | 9/2011 | Ortler |
| 2006/0055394 A1 | 3/2006 | Dunsmore |
| 2009/0027063 A1 | 1/2009 | Scholz et al. |
| 2012/0295548 A1 | 11/2012 | Dunsmore |

FOREIGN PATENT DOCUMENTS

| CN | 101592717 A | 12/2009 |
| CN | 202003020 U | 10/2011 |
| EP | 0505391 A1 | 9/1992 |
| JP | 2000329806 | 11/2000 |
| JP | 2006-78479 A | 3/2006 |

OTHER PUBLICATIONS

Ballo, "Measuring absolute group delay of multistage converters", 33rd European Microwave Conference, vol. 1, p. 89-92 (2003).

(Continued)

*Primary Examiner* — Lam Nguyen

(57) ABSTRACT

A method of calibrating a test instrument comprises determining a first response of a calibration device on the test instrument over a first set of operating ranges, determining a derived second response of the calibration device on the test instrument over a second set of operating ranges based on the first response, measuring the second response of the calibration device on the test instrument over the second set of operating ranges, and determining correction factors of the test instrument for the second set of operating ranges based on a comparison between the measured second response and the derived second response.

16 Claims, 6 Drawing Sheets

(56) References Cited

OTHER PUBLICATIONS

Dunsmore, "Novel Method for Vector Mixer Characterization and Mixer Test System Vector Error Correction", Proceedings of the IEEE MTT-S Symposium, Jun. 2002.
"Novel Approaches for Measuring Frequency Converted Group Delay", Rohde & Schwarz, Apr. 2010, http://www.ieee.li/pdf/viewgraphs/vna_based_group_delay_measurement.pdf.
Chinese Office Action dated Jan. 22, 2018 with English translation.
Chinese Search Report dated Jan. 11, 2017 with English translation.

\* cited by examiner

CALIBRATION OF TEST INSTRUMENT OVER EXTENDED OPERATING RANGE

BACKGROUND

Test instruments are commonly used to evaluate operating characteristics of electrical equipment such as integrated circuits, communication systems, and so on. For example, vector network analyzers (VNAs) are commonly used to evaluate the response characteristics of radio-frequency (RF) or microwave frequency circuits or systems.

To ensure accurate performance of a test instrument, a calibration procedure is typically performed on the instrument before it is used in practice. For example, a VNA may be calibrated by measuring the response characteristics of its receivers and then adjusting subsequent receiver measurements for improved accuracy according to the measured characteristics. Such a calibration procedure may be performed, for instance, when manufacturing, initializing, or first deploying the test instrument.

In a conventional calibration procedure, the test instrument is connected to a device under test (DUT) having a known response. This DUT may be referred to as a calibration standard, a reference device, or a known device. The DUT's known response may be, for instance, a known amplitude response, phase response, or group delay response. Next, the test instrument measures the response of the calibration standard and compares the measured response to the known response. Finally, the test instrument is adjusted or calibrated according to any difference between the known response and the measured response. More specifically, the test instrument's measurement parameters are adjusted no that the measured response will correspond more precisely to the known response.

As an example of the above calibration procedure, suppose the test instrument is a VNA and the calibration procedure is used to calibrate the amplitude response of the VNA's receivers. Further suppose that the known response is represented as "K" and the measured response is represented as "M=K+α", where α represents the difference between the known and measured response. Under these circumstances, the VNA receivers can be calibrated by adjusting their amplitude measurements by a correction factor corresponding to the value of Δ so that future measurements will be consistent with the known response.

In general, the above calibration procedure requires the ability to reliably measure the response characteristic of interest. For example, when calibrating amplitude response, the calibration procedure must be able to reliably measure signal amplitude at an input and an output of the calibration standard in order to measure a change in amplitude between the input and output. This type of amplitude measurement can typically be carried out in a straightforward manner using a power meter to detect respective signal amplitudes at the input and output. In other types of calibration, however, more sophisticated techniques may be required to perform the relevant measurements. For instance, when calibrating the phase response of a test instrument using a frequency translation device (FTD) (e.g., a mixer) as the calibration standard, it may be difficult to determine phase shifts between the input and output of the calibration standard due to the change of frequency between the input and output. This difficulty stems from the fact that there is currently no available general purpose "phase meter" (i.e., analogous to a "power meter") capable of detecting absolute phase levels at the input and output of an FTD.

To address the above difficulty, a new technique has been developed for calibrating the phase response of a test instrument using a harmonic comb generator as the calibration standard. In other words, the new technique can perform phase calibration as long as the calibration standard is a harmonic comb generator having a known phase response. In this context, such a harmonic comb generator can be referred to as a "phase reference", and the calibration technique can be referred to as a "phase reference" calibration technique. Examples of the phase reference calibration technique are described in further detail in commonly-owned U.S. Patent Application Publication No. 2012/0295548 filed May 18, 2011 (the '548 Publication), the subject matter of which is hereby incorporated by reference.

Unfortunately, the phase reference technique has at least two significant shortcomings. First, in most practical contexts, the phase reference has a limited range of operation. For instance, it may operate over a range of 55 MHz to 67 GHz. Accordingly, the phase reference may not be used to calibrate phase response of the receivers of a VNA or other test instrument at frequencies below 55 MHz or above 67 GHz. Second, the phase reference is generally limited to discrete frequencies, referred to as cardinal frequencies. For instance, a typical phase reference may comprise a harmonic comb generator that generates signals at multiples of 10 MHz, e.g., 60 MHz, 70 MHz, etc. The phase reference cannot be used to directly calibrate phase response between those frequencies, nor does a typical calibration lend itself to interpolation between those frequencies.

In view of the foregoing, there is a general need for new approaches to calibration of test instruments that overcome the shortcomings of conventional approaches.

SUMMARY

In a representative embodiment, a method of calibrating a test instrument comprises determining a first response of a calibration device on the test instrument over a first set of operating ranges, determining a derived second response of the calibration device on the test instrument over a second set of operating ranges based on the first response, measuring the second response of the calibration device on the test instrument over the second set of operating ranges, and determining correction factors of the test instrument for the second set of operating ranges based on a comparison between the measured second response and the derived second response.

In another representative embodiment, a method of calibrating a network analyzer comprises determining a first response of an FTD on the network analyzer with respect to a first input frequency range and a first output frequency range, determining a derived second response of the FTD on the network analyzer with respect to a second input frequency range and a second output frequency range based on the first response, measuring the second response of the FTD on the network analyzer with respect to the second input frequency range and the second output frequency range, and determining correction factors of network analyzer for the second input frequency range and the second output frequency range based on a comparison between the measured second response and the derived second response.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

Figure 1A:
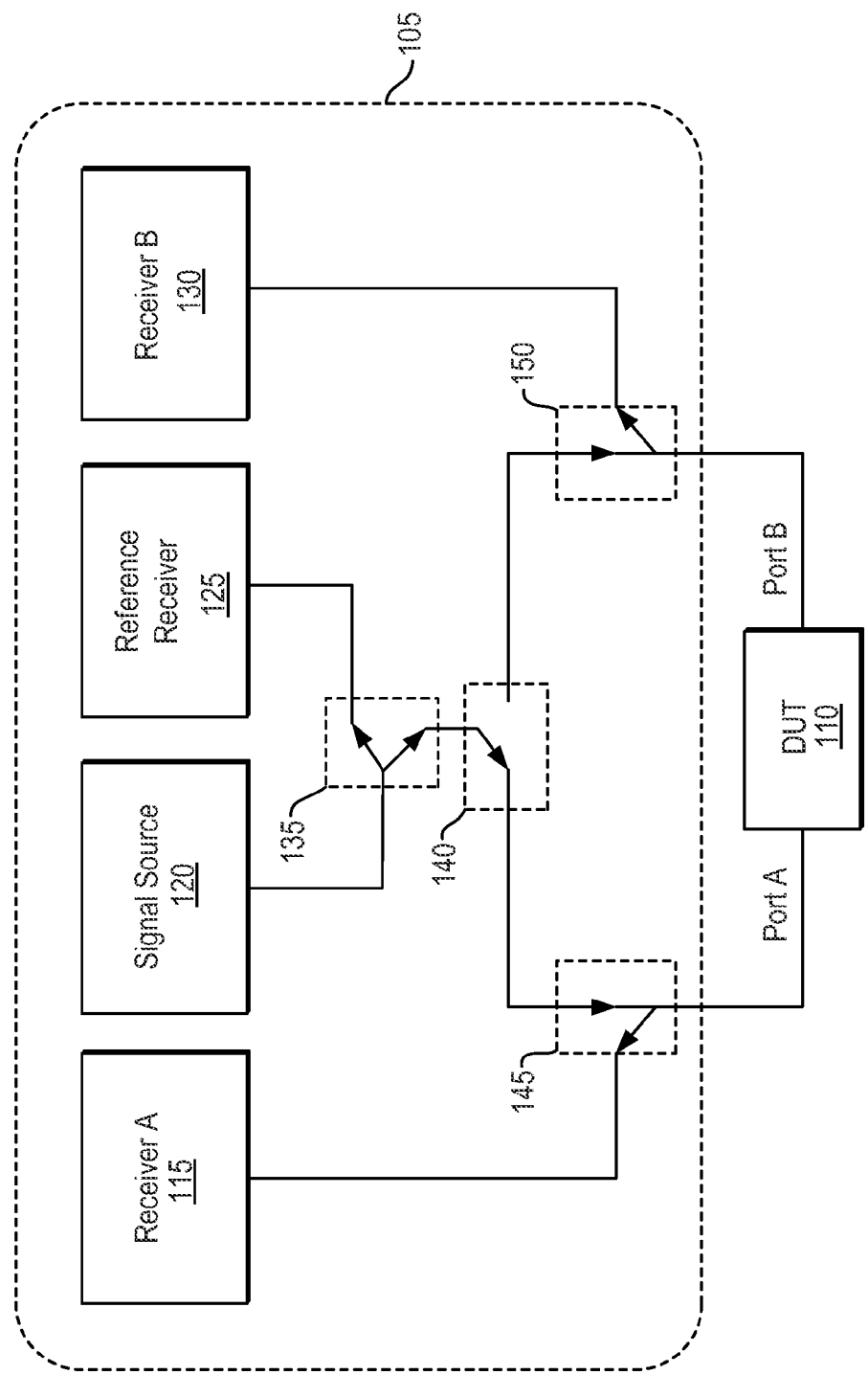
FIG. 1A is a block diagram of a test instrument configured for calibration using a first type of DUT, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

In general, the described embodiments relate to techniques and technologies for calibrating a test instrument such as a VNA. The described embodiments allow the test instrument to be calibrated across an extended set of operating ranges beyond that of a calibration standard. The extended set of ranges may include, for instance, frequency ranges between cardinal frequencies of the calibration standard, and frequency ranges above or below the maximum or minimum operating ranges of the calibration standard.

In certain embodiments, a test instrument is calibrated over first and second sets of frequency ranges. The test instrument is calibrated over the first set of frequency ranges by (a) observing its performance over the first set when connected to a first calibration device having a known response over that set of ranges, and (b) generating correction factors for the test instrument based on the observed performance. Next, the test instrument is calibrated over the second set of frequency ranges by (c) observing its performance over the first set of frequency ranges when connected to a second calibration device having unknown characteristics over that set of ranges (d) characterizing the performance of the second calibration device over the first set of frequency ranges by comparison with the performance of first calibration device, (e) observing the performance of the second calibration device over the second set of frequency ranges, and (f) determining correction factors for the test instrument over the second set of frequency ranges based on the observed performance of the second calibration device over the second set and the characterized performance of the second calibration device over the first set.

In these embodiments, the first and second sets of ranges may be, for instance, sets of frequency ranges applied to the respective input and output ports of a frequency mixer. As one example, using a phase reference device as the first calibration device, the first set of ranges may comprise an input frequency range r1 and an output frequency range r2 of the phase reference device. Then, using a mixer of unknown response (an "unknown mixer") as the second calibration device, the second set of ranges may comprise an input frequency range r1 and an output frequency range r3. Thus, the use of the second calibration device can be used to extend the scope of calibration from ranges {r1, r2} to {r1, r2, r3}.

In the above procedure, step (f) can provide a fairly accurate estimate of correction factors if the behavior of the second calibration device over the second set of frequency ranges can be accurately inferred from its behavior over the first set of frequency ranges. Such an inference may be possible, for instance, where the second calibration device has response characteristics that are "smooth", i.e., susceptible to interpolation or extrapolation. The above calibration procedure may be particularly useful when a calibration standard is available for the first set of frequency ranges, but not the second. Additionally, as will be understood from the following description, the above calibration procedure can be particular useful in calibrating the phase response or group delay response of a test instrument used to measure FTDs such as mixers.

In the description that follows, several embodiments will be described with reference to VNAs that are calibrated for measurement of phase response or group delay response on mixers or other FTDs. Nevertheless, the described concepts are not limited to specific types of test instruments, calibrations, or DUTs. For instance, these concepts could alternatively be applied to other test instruments such as network analyzers or spectrum analyzers, to other types of calibration such as amplitude response calibration, and to other types of DUTS such as filters, to name but a few alternatives.

Figure 1B:
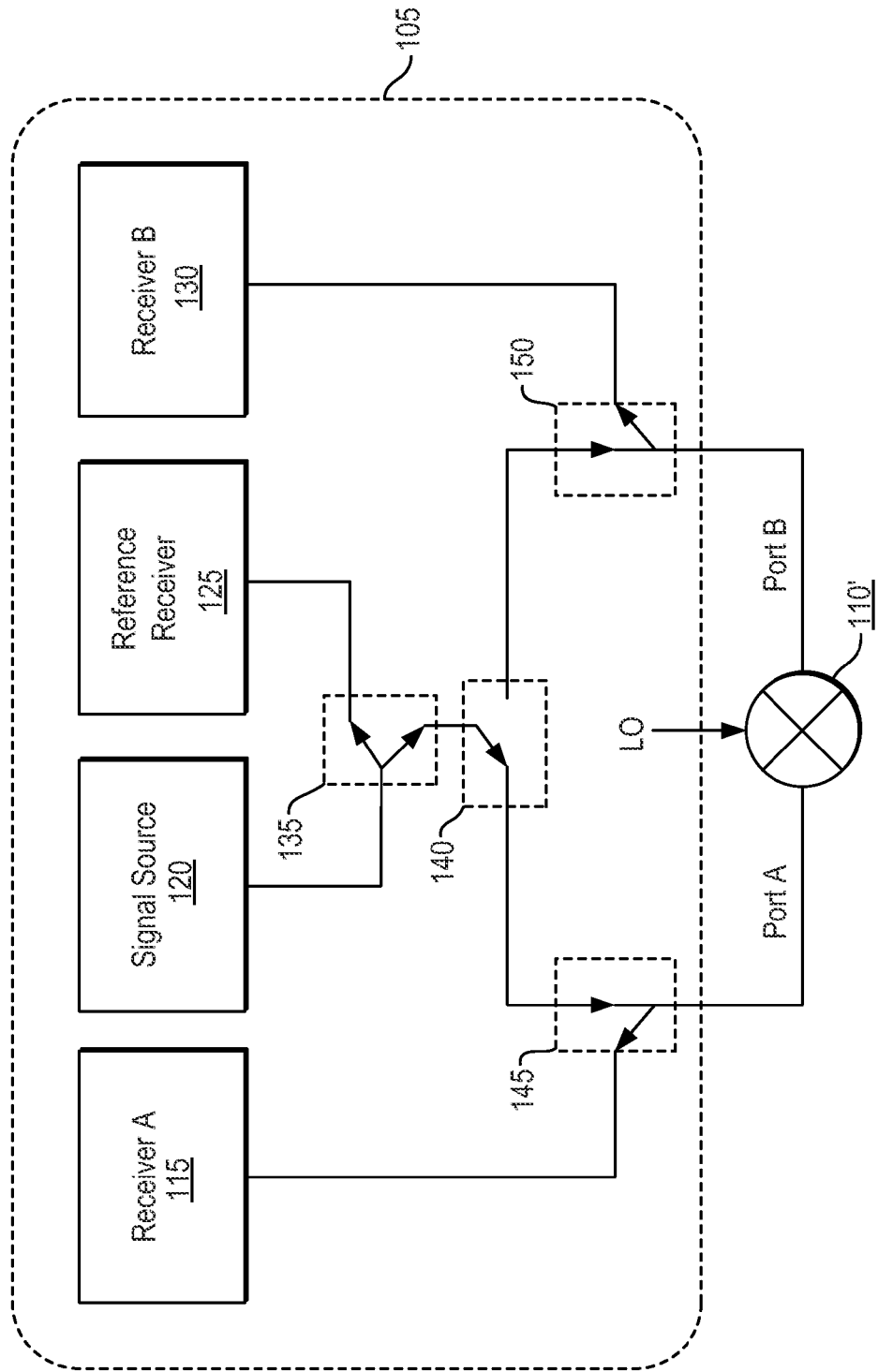
FIG. 1B is a block diagram of the test instrument configured for calibration using a second type of DUT, according to a representative embodiment.

FIG. 1A is a block diagram of a test instrument 105 configured for calibration using a first type of DUT, according to a representative embodiment. FIG. 1B is a block diagram of test instrument 105 configured for calibration using a second type of DUT, according to another representative embodiment. These diagrams are provided in order to illustrate some basic, non-limiting contexts in which calibration may be performed using methods described below.

Referring to FIG. 1A, test instrument 105 comprises a VNA arranged in a configuration to perform a two-port S-parameter calibration using a DUT 110. DUT 110 can be any type of two-port device capable of facilitating a desired calibration procedure. For example, it may be a frequency filter, a diode, or an amplifier, to name but a few alternatives. Test instrument 105 comprises a first receiver 115 (the "A" receiver), a second receiver 130 (the "B" receiver), a signal source 120, a reference receiver 125, a splitter 135, a switch 140, and directional couplers 145 and 150.

In a typical test procedure, signal source 120 generates test signals to be applied to DUT 110. The test signals may be generated at different frequencies using a frequency synthesizer in signal source 120. For example, the test signals may be swept across a range of frequencies and/or phases to perform various types of response measurements.

The test signals are transmitted through splitter 135 to reference receiver 125 and a first port of DUT 110 (the "A" port). A portion of the test signals is reflected from the "A" port and transmitted via directional coupler 145 to the "A" receiver. Another portion of the test signals is transmitted through DUT 110 to produce output signals at a second port of DUT 110 (the "B" port), and the output signals are transmitted via directional coupler 150 to the "B" receiver.

In a calibration procedure, DUT 110 may be a calibration standard. Accordingly, calibration can be performed by comparing the known response characteristics of the calibration standard with those measured by test instrument 105 through first receiver 115, reference receiver 125, and second receiver 130.

Referring to FIG. 1B, test instrument 105 is shown in a configuration where it is connected to a DUT 110' comprising a mixer or other type of FTD. Compared to DUT 110, DUT 110' further comprises an additional input for receiving a local oscillator (LO) signal. The LO signal can be generated by an additional frequency synthesizer in test instrument 105.

In a typical test or calibration procedure using the configuration of FIG. 1B, test instrument 105 operates as described above in relation to FIG. 1A, except that certain procedures may be more complicated due to frequency translation between the input and output ports of DUT 110'. For instance, it may be more difficult to perform phase response measurements or calibration with DUT 110' due to the frequency translation.

In general, amplitude response measurements can be performed in the configuration of FIG. 1A or 1B using a power meter to calibrate each of the receivers. However, phase response measurements typically require a more sophisticated approach, such as the use of a "phase reference" as DUT 110' to determine absolute phase shifts at the respective input and output ports of DUT 110'. The use of such a phase reference is described, for instance, in the '548 Publication.

A typical calibration procedure using the phase reference comprises a 2 port S-parameter calibration and a single phase reference connection. There is generally no requirement for the phase reference calibration technique to maintain any particular LO frequency. A drawback of such a calibration procedure, however, is that it is generally limited to performing calibration at cardinal frequencies of the phase reference, e.g., intervals of 10 MHz, and it may be restricted from performing calibration above or below certain frequencies. For instance, in some implementations, a phase reference can be used to calibrate all the receivers of test instrument 105 from 55 Mhz to 67 Ghz, but not outside of this range. Accordingly, to extend the calibration below 55 Mhz, an "unknown device" (e.g., an "unknown mixer") with a flat group delay from DC to 600 Mhz may be used. An absolute level of the phase delay of the unknown device is measured above 55 Mhz using the phase reference calibration. Then, once the absolute phase delay has been identified, the calibration also measures the unknown device below 55 Mhz. Error terms for the calibration can then be computed as a difference between raw receiver measurements as compared to the absolute phase delay.

The calibration process can also use input match and output match measurements of the unknown device to produce a calibration that is less susceptible to mismatch error. This extrapolation relies on the having an unknown device with a smooth response from below 55 MHz to above 55 MHz. A simple example of a device having a smooth phase response is one with flat group delay response. In general, the smoothness of the phase or group delay response can be readily estimated from the smoothness of the amplitude response.

Figure 2A:
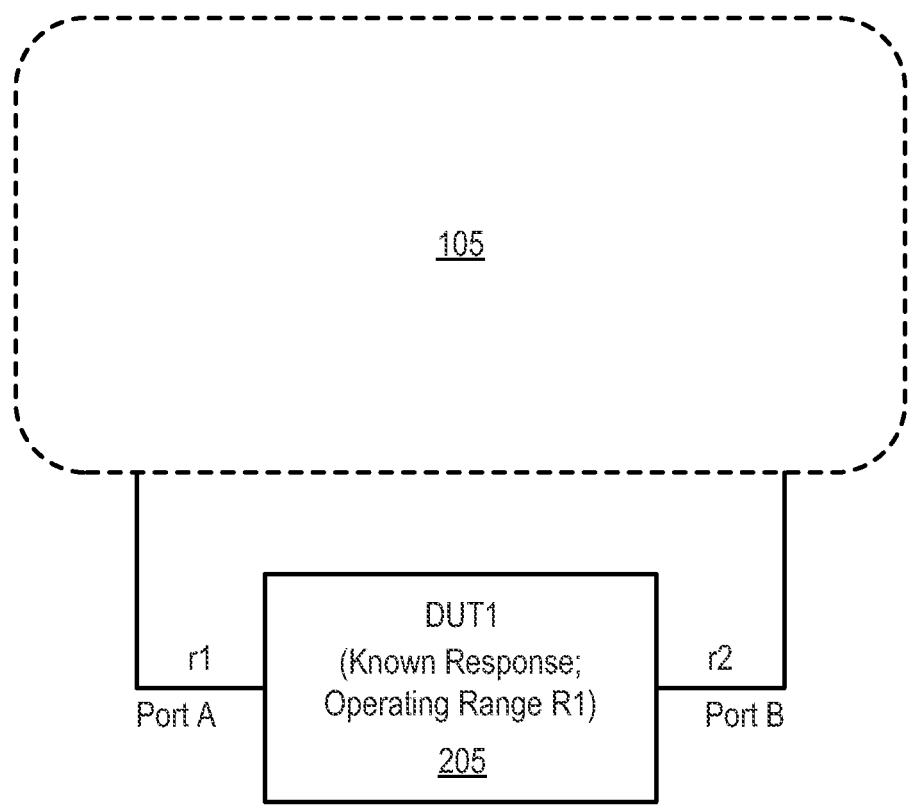
FIG. 2A is a block diagram of the test instrument configured for a first stage of calibration using a DUT having a known response over a first set of operating ranges, according to a representative embodiment.
Figure 2B:
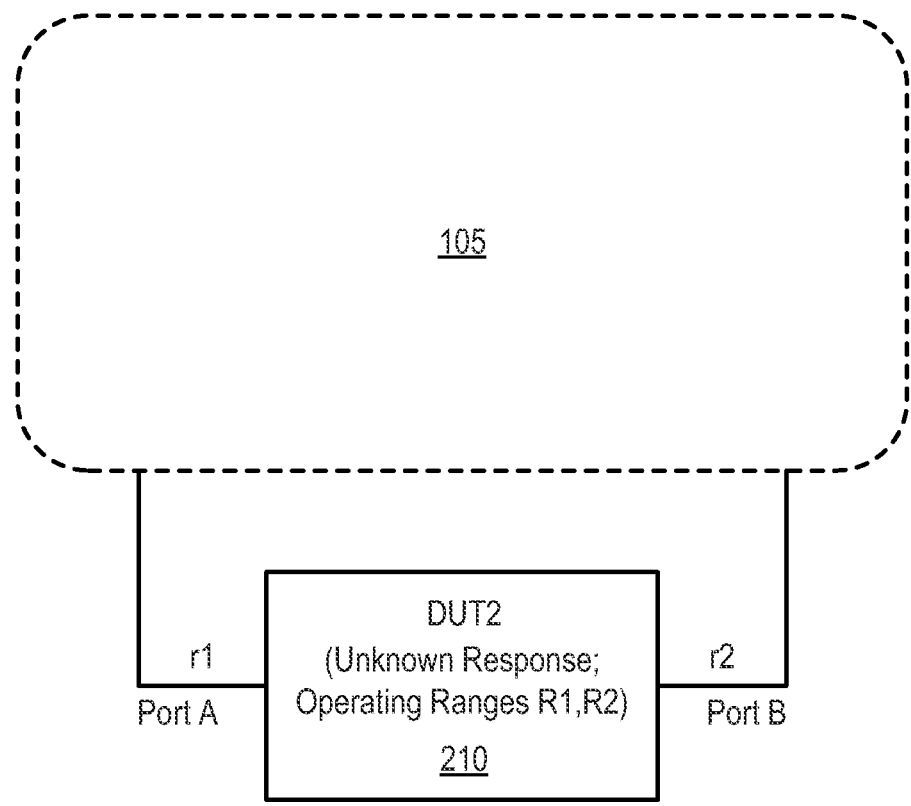
FIG. 2B is a block diagram of the test instrument configured for a second stage of calibration using a DUT having an unknown response over the first set of operating ranges and a second set of operating ranges, according to a representative embodiment.
Figure 2C:
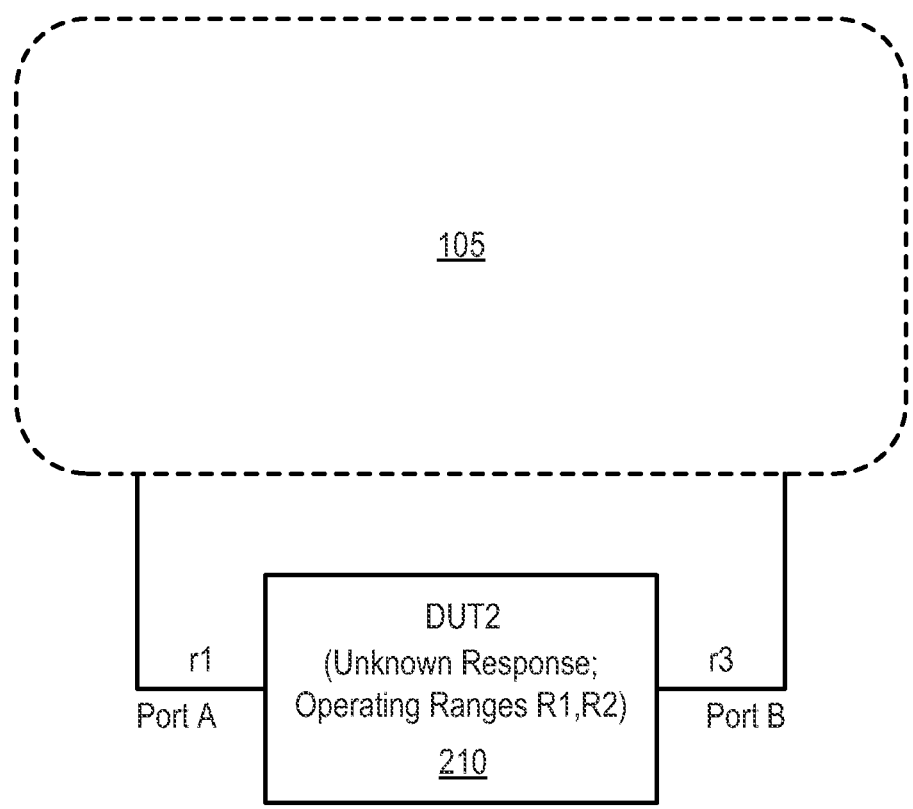
FIG. 2C is a block diagram of the test instrument configured for a third stage of calibration using the DUT having the unknown response and the second set of operating ranges, according to a representative embodiment.

FIGS. 2A through 2C show example configurations of test instrument 105 during a calibration procedure using known device 205 and an unknown device 210. For simplicity of explanation, it will be assumed that known device 205 comprises a phase reference having a known response over a first set of ranges $R1 \epsilon \{r1, r2\}$, and unknown device 210 comprises a mixer having an unknown response over both the first set of ranges R1 and a second set of ranges $R2 \epsilon \{r1, r3\}$. Although not shown in FIGS. 2A through 2C, known device 205 and unknown device 210 each receive an LO input signal during the calibration, and they generate their respective output signals by translating the frequency of their respective input signals based on the LO signal.

In the described examples, test instrument 105 is calibrated by using the ranges r1 and r2 as the respective input and output frequency ranges of known device 205 as shown in FIG. 2A, then using the same ranges as the input and output frequency ranges of unknown device 210 as shown in FIG. 2B, and then finally using the ranges r1 and r3 as the respective input and output frequency ranges of unknown device 210 as shown in FIG. 2C.

In the example of FIGS. 2A through 2C, the use of unknown device 210 allows the calibration procedure to be extended to the range r3, which can be between two of the other ranges r1 and r2, or outside of those ranges. Where the range r3 is between two of the other ranges r1 and r2, the calibration procedure can be said to be extended by interpolation. Otherwise, it can be said to be extended by extrapolation. In order to extend the calibration by interpolation or extrapolation, it will be assumed that the unknown mixer has a smooth response between the range r3 and one or more of the other ranges.

Referring to FIG. 2A, in the first stage of calibration, known device 205 is connected to test instrument 105. Test instrument 105 measures the absolute phase or group delay response of known device 205 over the first set of ranges $R1 \epsilon \{r1, r2\}$ using techniques described in the '548 Publication. Then, the measured response is compared to the known phase delay or group delay response of known device 205 to determine correction factors for the receivers of test instrument 105 over respective ranges r1 and r2. This set of correction factors can be referred to as a first set of correction factors.

Referring to FIG. 2B, in the second stage of calibration, unknown device 210 is connected to test instrument 105. Test instrument 105 measures the absolute phase or group delay response of unknown device 210 over the first set of ranges R1 and determines a corrected response (or putative "actual" response) of the unknown device over the same set of ranges by applying the receiver correction factors to the measured response. Then, based on the assumed smooth response of unknown device 210, a corrected response (or putative "actual" response) of unknown device 210 over the second set of ranges R2 is estimated or inferred from the corrected response over the first set of ranges R1. In this context, the corrected response of unknown device 210 over the second set of ranges R2 can be referred to as a "derived response" because it is derived by estimation or inference from the corrected response over the first set of ranges R1. In general, a "derived response" can be determined through any suitable derivation process. For example, it can be determined through a derivation process based on available data, assumptions, mathematical modeling, analytical techniques, etc.

Referring to FIG. 2C, in the third stage of calibration, test instrument 105 measures the absolute phase or group delay response of unknown device 210 over the second set of ranges R2 and compares the measured response to a derived response (e.g., the corrected response or putative "actual" response) determined through estimation or inference in the second stage. Finally, correction factors of test instrument 105 can be determined for the second set of ranges R2 based on the comparison. These correction factors, also referred to as a second set of correction factors, provide a calibration for test instrument 105 over the range r3, which effectively extends beyond the calibration range achieved with known device 205 by itself.

Figure 3:
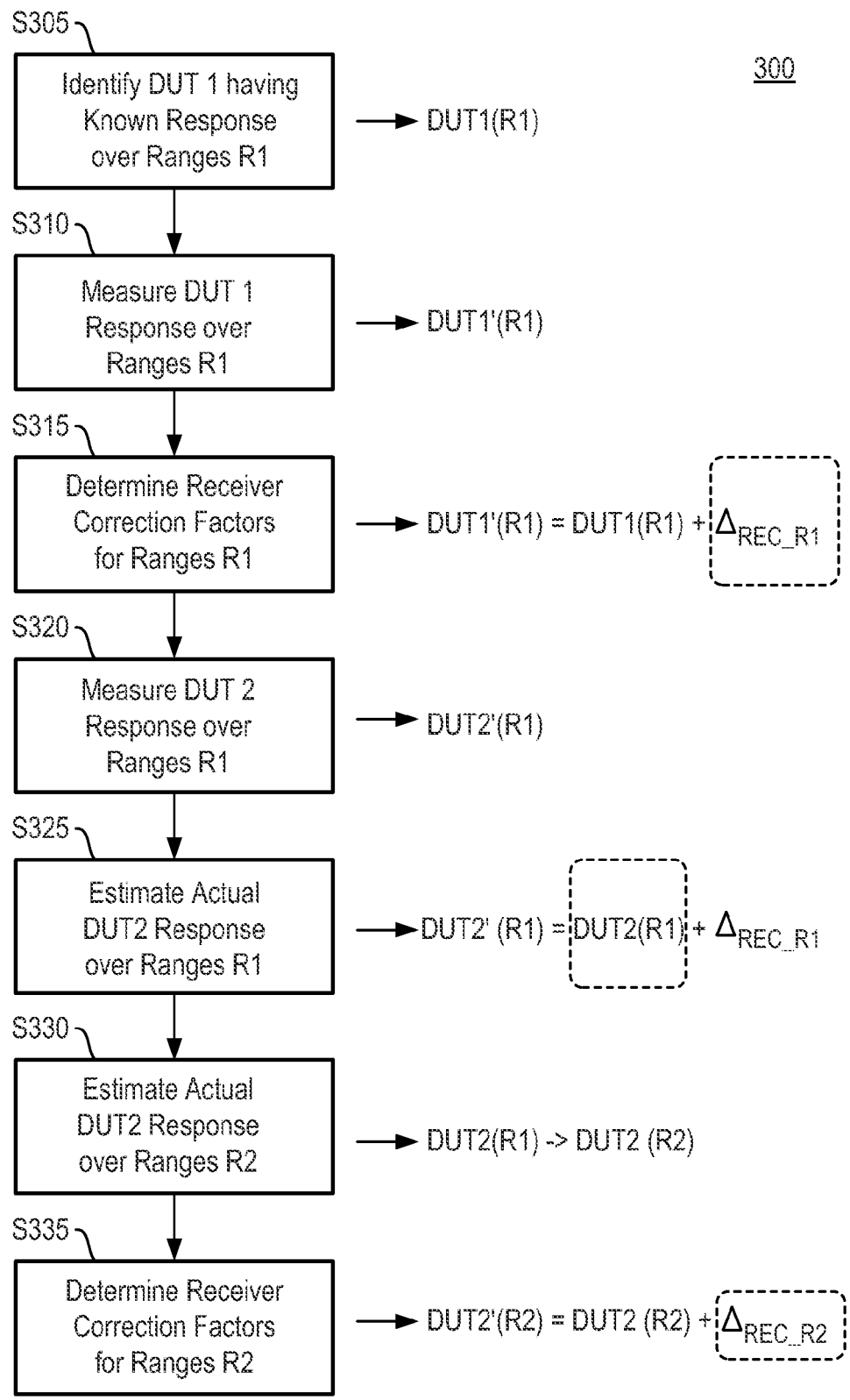
FIG. 3 is a flowchart illustrating a method of calibrating a test instrument, according to a representative embodiment.

FIG. 3 is a flowchart illustrating a method of calibrating a test instrument, according to a representative embodiment. For explanation purposes, it will be assumed that the method is performed with respect to test instrument 105 of FIGS. 1 and 2, although the method is not restricted to being performed by this or any other particular test instrument. In the description that follows, example method steps will be indicated by parentheses (SXXX) to distinguish them from example device or system components.

Referring to FIG. 3, the method begins by identifying a device DUT1 having a known response over a first set of operating ranges $R1 \epsilon \{r1,r2\}$ (S305). In this example, DUT1 may be known device 205 of FIG. 2A. The known response, or "actual response" of this device over a range R1 is denoted DUT1(R1), and similar notation is used to represent other "actual" responses of this and other devices. Next, the method measures the response of DUT1 over the first set of ranges R1 (S310). The measured response of this device over the first set of ranges R1 is denoted DUT1'(R1), and similar notation is used to represent other "measured" responses of this and other devices.

Next, the method determines correction factors for the receivers of test instrument 105 based on the actual responses identified in step S305 and the measured responses identified in step S310 (S315). The correction factors for the receiver over the set of ranges R1 are denoted $\Delta_{REC\_R1}$, and similar notation is used to represent correction factors of the receivers over other ranges. These correction factors are estimated as illustrated by an equation in FIG. 3.

Next, the method measures the response of an unknown device, DUT2, over a second set of operating ranges $R2 \epsilon \{r1, r3\}$ (S320). In this example, DUT2 may be unknown device 210 of FIG. 2B. The measured response is denoted DUT2' (R1). Next, actual response of DUT2 over ranges R2 is inferred or estimated from the measured response over those ranges and the correction factors determined in step S315 (S325). The actual response is denoted DUT2(R1), and it is estimated as illustrated by an equation in FIG. 3.

Once the actual response of DUT2 has been inferred or estimated in step S325, the actual response over the first set of ranges R1 is then used to estimate the actual response of DUT2 over the second set of ranges R2, which is represented as DUT2(R2) (S330). This estimate can be made by interpolating or extrapolating the actual responses of DUT2, assuming that DUT2 has a smooth response between the range r3 and one or more of the other ranges r1 and r2. Finally, the method determines correction factors for the receivers of test instrument 105 based on the measured and actual responses DUT2'(R2) and DUT2(R2), as illustrated by the equations in FIG. 3 (S335).

As indicated by the foregoing, the above techniques can be used to extend the calibration range of a test instrument beyond the operating range of a calibration standard. For example, some of the described techniques use a phase reference to calibrate a test instrument outside of the frequency range of the phase reference. In certain embodiments, the described techniques can be used to calibrate below 55 Mhz, for instance. In other embodiments, these techniques can be used to calibrate above the 67 Ghz, for instance. Additionally, these techniques can be used to extend a phase reference calibration between cardinal frequencies of the phase reference. More generally, the described techniques could be extended to other measurement classes where known measurements standards are well specified at cardinal points, and unknown but smooth standards are available which can provide interpolation across known points or extrapolation beyond the known standard values.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method, executed by a test instrument, of calibrating the test instrument, the method comprising:
    determining a measured first response of a first calibration device over a first set of operating ranges;
    determining a derived second response of the first calibration device over a second set of operating ranges based on the measured first response and a measured third response of a second calibration device over the first set of operating ranges;
    determining a measured second response of the second calibration device over the second set of operating ranges; and
    determining correction factors of the test instrument for the second set of operating ranges based on a comparison between the measured second response and the derived second response.

2. The method of claim 1, wherein the derived second response of the calibration device is determined by interpolating the measured first response.

3. The method of claim 1, wherein the derived second response of the calibration device is determined by extrapolating the first response.

4. The method of claim 1, wherein the first and second sets of operating ranges are sets of frequency ranges.

5. The method of claim 1, wherein the test instrument is a network analyzer, and the correction factors are used to adjust measurements obtained by receivers of the network analyzer.

6. The method of claim 1, wherein the correction factors are phase response correction factors for the test instrument.

7. The method of claim 1, wherein the correction factors are group delay response correction factors for the test instrument.

8. The method of claim 1, wherein the measured first response and derived and measured second responses are phase responses.

9. The method of claim 1, wherein the first and second responses are group delay responses.

10. The method of claim 1, wherein determining the first response of the calibration device comprises measuring the first response of the calibration device on the test instrument over the first set of operating ranges, and correcting the measured first response using correction factors of the test instrument for the first set of operating ranges.

11. The method of claim 10, wherein the correction factors of the test instrument for the first set of operating ranges are determined by calibrating the test instrument over the first set of operating ranges using a phase reference device.

12. The method of claim 11, wherein the phase reference device has an operating range that does not extend over the second set of operating ranges.

13. The method of claim 11, wherein the first set of operating ranges comprises only cardinal frequencies of the phase reference device.

14. The method of claim 11, wherein the phase reference device comprises a harmonic comb generator.

15. The method of claim 1, wherein the calibration device comprises a frequency translation device (FTD), the first set of operating ranges comprises a first set of input and output frequency ranges of the FTD, and the second set of operating ranges comprises a second set of input and output frequency ranges of the FTD.

16. The method of claim 1, wherein the calibration device comprises a mixer having an unknown response over the first and second sets of operating ranges.

* * * * *